US012323149B2

(12) United States Patent
Chiang et al.

(10) Patent No.: US 12,323,149 B2
(45) Date of Patent: Jun. 3, 2025

(54) TEMPERATURE COMPENSATED OSCILLATOR AND RING OSCILLATOR TEMPERATURE COMPENSATION METHOD

(71) Applicant: Richtek Technology Corporation, Zhubei (TW)

(72) Inventors: Chia-Tseng Chiang, New Taipei (TW); Yi-Hsiang Juan, Taipei (TW)

(73) Assignee: RICHTEK TECHNOLOGY CORPORATION, Zhubei (TW)

( * ) Notice: Subject to any disclaimer, the term of this patent is extended or adjusted under 35 U.S.C. 154(b) by 0 days.

(21) Appl. No.: 18/533,439

(22) Filed: Dec. 8, 2023

(65) Prior Publication Data

US 2024/0213964 A1 Jun. 27, 2024

(30) Foreign Application Priority Data

Dec. 27, 2022 (TW) .................................. 111150204

(51) Int. Cl.
*H03K 3/03* (2006.01)
*H03K 3/011* (2006.01)

(52) U.S. Cl.
CPC ........... *H03K 3/0315* (2013.01); *H03K 3/011* (2013.01)

(58) Field of Classification Search
CPC ............................ H03K 3/0315; H03K 3/011
USPC ...................... 331/57, 167, 117 FE, 183, 176
See application file for complete search history.

(56) References Cited

U.S. PATENT DOCUMENTS

| 5,600,280 | A | * | 2/1997 | Zhang | H03B 5/24 330/252 |
|---|---|---|---|---|---|
| 8,076,980 | B2 | | 12/2011 | Liu | |
| 8,248,171 | B1 | | 8/2012 | Bugbee et al. | |
| 2022/0247393 | A1 | * | 8/2022 | Helmy Zaky | H03K 17/6872 |

FOREIGN PATENT DOCUMENTS

CN 106209083 A 12/2016

OTHER PUBLICATIONS

"Designing a Ring-VCO for RFID Transponders in 0.18 μm CMOS Process", by Jubayer Jalil, Mamun Bin Ibne Reaz, Mohammad Arif Sobhan Bhuiyan, Labonnah Farzana Rahman, and Tae Gyu Chang; Hindawi Publishing Corporation, The Scientific World Journal vol. 2014, Article ID 580385, 6 pages; http://dx.doi.org/10.1155/2014/580385.

* cited by examiner

Primary Examiner — Arnold M Kinkead
(74) Attorney, Agent, or Firm — Tung & Associates

(57) ABSTRACT

A temperature compensated oscillator includes: a current source configured to generate a proportional to absolute temperature (PTAT) current; and a ring oscillator which has a complementary to absolute temperature (CTAT) oscillation frequency and is configured to receive the PTAT current to generate an oscillation signal. The current source includes a tracking MOS device and a resistor which are coupled in series. The tracking MOS device and at least one MOS device of the ring oscillator have the same conductive type, and a gate-source voltage of the tracking MOS device and a gate-source voltage of the at least one MOS device have the same CTAT coefficient, such that when the temperature compensated oscillator operates, the tracking MOS device and the at least one of the first MOS device have a tracking effect to compensate the CTAT oscillation frequency.

20 Claims, 7 Drawing Sheets

TEMPERATURE COMPENSATED OSCILLATOR AND RING OSCILLATOR TEMPERATURE COMPENSATION METHOD

CROSS REFERENCE

The present invention claims priority to TW 111150204 filed on Dec. 27, 2022.

BACKGROUND OF THE INVENTION

Field of Invention

The present invention relates to a ring oscillator, in particular to a ring oscillator with temperature compensation function and a ring oscillator temperature compensation method.

Description of Related Art

The following patents are relevant to the present invention: U.S. Pat. No. 8,076,980B2 and U.S. Pat. No. 8,248,171B1.

Please refer to FIG. 1, which shows a schematic diagram of a temperature compensated oscillator of the prior art. The temperature compensated oscillator 1000 of the prior art includes a current generating circuit 101 and a ring oscillator 102, wherein each of the current generating circuit 101 and the ring oscillator 102 includes plural metal oxide semiconductor (MOS) devices. In the ring oscillator 102, the required frequency is generated by three inverters. The ring oscillator 102 itself has a negative temperature delay characteristic; this is due to the mobility of the devices. To be more specific, the mobility of the device becomes lower as the temperature goes higher. Since the mobility of the device is complementary to absolute temperature (CTAT), as the temperature goes higher, the delay time of the ring oscillator becomes longer, and the oscillation frequency of the ring oscillator 102 becomes lower.

Therefore, the current generating circuit 101 generates a proportional to absolute temperature (PTAT) current Io1, to compensate the CTAT delay of the ring oscillator 102, thereby compensating the oscillation frequency of the ring oscillator 102 which is negatively correlated with temperature, so that the oscillation frequency of the clock signal Vo1 is not affected by temperature.

According to the constant transconductance gain (constant-gm) current formula, the PTAT current Io1 can be represented by the following formula 1:

$$Io1 = \frac{2}{\mu_n C_{ox}(W/L)} \times \frac{1}{R^2}\left(1 - \frac{1}{\sqrt{K}}\right)^2 \quad \text{(formula 1)}$$

In formula 1, μ is the mobility of the metal oxide semiconductor device; Cox is the equivalent capacitance of the metal oxide semiconductor device; W is the channel width of the metal oxide semiconductor device; L is the channel length of the metal oxide semiconductor device; R is the sum of the resistances of the resistors R1 and R2 in the current generating circuit 101; and K is a constant.

The shortcoming of the above-mentioned prior art is that the PTAT current Io1 is related to the square of the CTAT resistance R, so the temperature compensation capability is poor.

In view of the above, to overcome the shortcoming of the above-mentioned prior art, the present invention proposes a temperature compensated oscillator with excellent temperature compensation capability. In the temperature compensated oscillator of the present invention, the PTAT current is related to the first power of the resistance, so it has a much better temperature compensation capability. In addition, the present invention makes use of the tracking function of the metal oxide semiconductor device, to achieve excellent temperature compensation under different process corner conditions of the metal oxide semiconductor device.

SUMMARY OF THE INVENTION

The present invention provides a temperature compensated oscillator, comprising: a current source, configured to generate a proportional to absolute temperature (PTAT) current; and a ring oscillator, having a complementary to absolute temperature (CTAT) oscillation frequency, wherein the ring oscillator is configured to receive the PTAT current to generate an oscillation signal, and the ring oscillator includes at least one first MOS device; wherein the current source comprises a tracking metal oxide semiconductor (MOS) device and a resistor connected in series; and wherein the tracking MOS device is of the same conductivity type as the at least one first MOS device in the ring oscillator, and the gate-source voltage of the tracking MOS device has the same CTAT coefficient as the gate-source voltage of the at least one first MOS device, so that when the temperature compensated oscillator operates, there is a tracking effect between the tracking MOS device and the at least one first MOS device, so as to compensate the CTAT oscillation frequency.

In one embodiment, the resistor has a CTAT resistance, and the PTAT current is proportional to a compensation current flowing through the resistor.

In one embodiment, the compensation current is equal to the gate voltage of the tracking MOS device minus the CTAT gate-source voltage of the tracking MOS device and divided by the CTAT resistance.

In one embodiment, the temperature coefficient of the gate voltage of the tracking MOS device is zero.

In one embodiment, the current source further comprises a current mirror circuit coupled to the tracking MOS device to mirror the compensation current into the PTAT current.

In one embodiment, the ring oscillator comprises at least three odd-numbered coupled inverters, and the inverters comprise the first MOS devices and a second MOS device connected in series with each other, wherein the conductivity type of the first MOS device is opposite to that of the second MOS device.

In one embodiment, the ring oscillator comprises at least three odd-numbered coupled delay units, and wherein the at least three odd-numbered coupled delay units are coupled in a latch form.

The present invention also provides a temperature compensated oscillator, comprising: a current source, configured to generate a proportional to absolute temperature (PTAT) current; and a ring oscillator, having a complementary to absolute temperature (CTAT) oscillation frequency, wherein the ring oscillator is configured to receive the PTAT current to generate an oscillation signal, and the ring oscillator includes at least one first MOS device; wherein the current source comprises a tracking metal oxide semiconductor (MOS) device and a resistor connected in series; and wherein the resistor has a CTAT resistance, and the PTAT current is proportional to a compensation current flowing through the resistor.

The present invention also provides a ring oscillator temperature compensation method, comprising: generating a proportional to absolute temperature (PTAT) current by a current source; and receiving the PTAT current by a ring oscillator having a complementary to absolute temperature (CTAT) oscillation frequency, to generate an oscillation signal, wherein the ring oscillator includes at least one first MOS device; wherein the current source comprises a tracking metal oxide semiconductor (MOS) device and a resistor connected in series; and wherein the tracking MOS device is of the same conductivity type as the at least one first MOS device in the ring oscillator, and the gate-source voltage of the tracking MOS device has the same CTAT coefficient as the gate-source voltage of the at least one first MOS device, so that when the temperature compensated oscillator operates, there is a tracking effect between the tracking MOS device and the at least one first MOS device, so as to compensate the CTAT oscillation frequency.

The present invention also provides a ring oscillator temperature compensation method, comprising: generating a proportional to absolute temperature (PTAT) current by a current source; and receiving the PTAT current by a ring oscillator having a complementary to absolute temperature (CTAT) oscillation frequency, and generating an oscillation signal; wherein the current source comprises a tracking metal oxide semiconductor (MOS) device and a resistor connected in series; wherein the resistor has a CTAT resistance, and the PTAT current is proportional to a compensation current flowing through the resistor.

The objectives, technical details, features, and effects of the present invention will be better understood with regard to the detailed description of the embodiments below, with reference to the attached drawings.

DESCRIPTION OF THE PREFERRED EMBODIMENTS

The drawings as referred to throughout the description of the present invention are for illustration only, to show the interrelations between the circuits and the signal waveforms, but not drawn according to actual scale.

Figure 1:
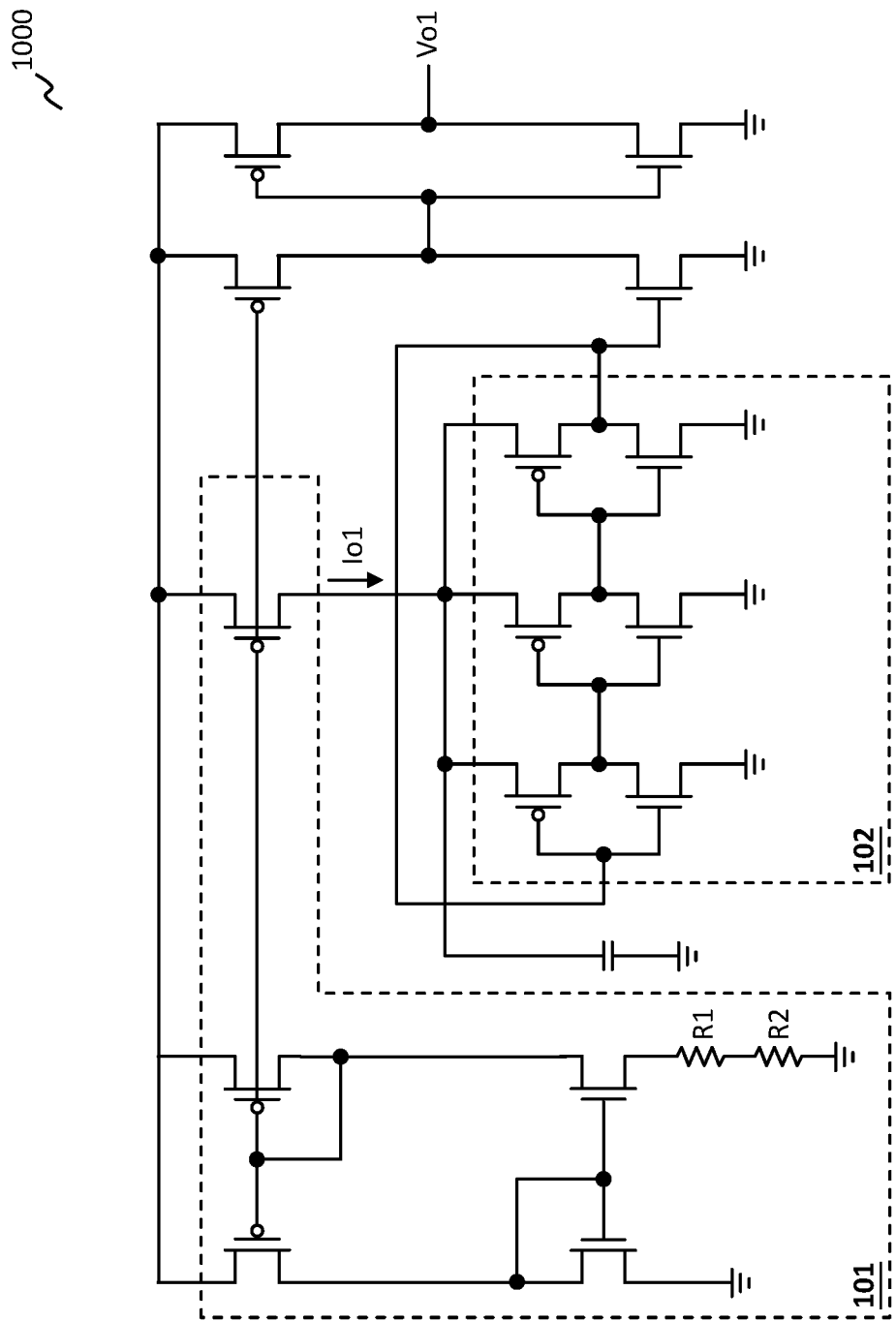
FIG. 1 shows a schematic diagram of a temperature compensated oscillator of the prior art.
Figure 2:
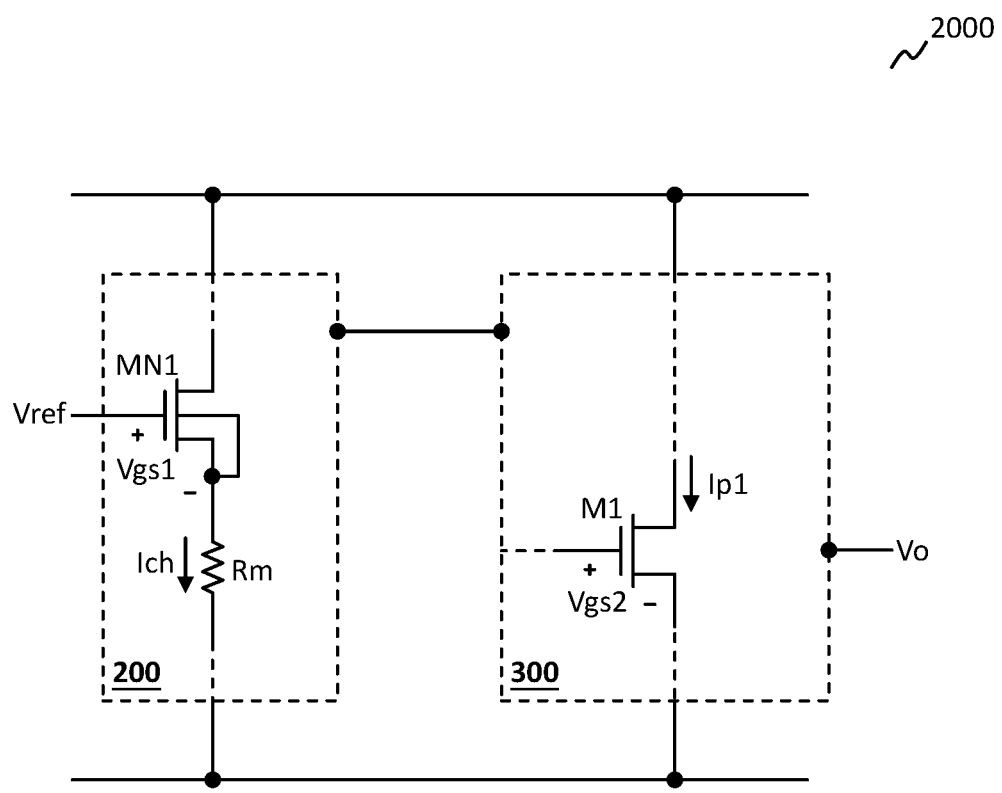
FIG. 2 shows a circuit diagram of a temperature compensated oscillator according to an embodiment of the present invention.

Please refer to FIG. 2. FIG. 2 shows a block diagram of a temperature compensated oscillator according to an embodiment of the present invention. As shown in FIG. 2, in one embodiment, the temperature compensated oscillator 2000 includes a current source 200 and a ring oscillator 300. In one embodiment, the current source 200 is configured to generate a proportional to absolute temperature (PTAT) current Ip1, and the current source 200 includes a tracking metal oxide semiconductor (MOS) device MN1 and a resistor Rm coupled in series with each other. In one embodiment, the ring oscillator 300 includes at least one MOS device. In the present embodiment, the at least one MOS device includes a MOS device M1. In one embodiment, the ring oscillator 300 has a complementary to absolute temperature (CTAT) oscillation frequency, and the ring oscillator 300 receives the PTAT current Ip1 to generate the oscillation signal Vo.

In one embodiment, the tracking MOS device MN1 has a gate voltage Vref, and the tracking MOS device MN1 and the MOS device M1 have the same conductivity type. In the present embodiment, both the tracking MOS device MN1 and the MOS device M1 are N-type metal oxide semiconductor devices (that is, NMOS devices). In one embodiment, the gate-source voltage Vgs1 of the tracking MOS device MN1 and the gate-source voltage Vgs2 of the MOS device M1 have substantially the same CTAT coefficient, so that when the temperature compensated oscillator 2000 operates, there is a tracking effect between the tracking MOS device and the MOS device M1 to compensate the CTAT oscillation frequency of the ring oscillator 300. In one embodiment, the resistor Rm has a CTAT resistance, and the PTAT current Ip1 is proportional to the compensation current Ich flowing through the resistor Rm. In one embodiment, the gate voltage Vref is independent of temperature and has a fixed voltage level.

That "the gate-source voltage Vgs1 of the tracking MOS device MN1 and the gate-source voltage Vgs2 of the MOS device M1 have substantially the same CTAT coefficient", means that both the gate-source voltage Vgs1 of the tracking MOS device MN1 and the gate-source voltage Vgs2 of the MOS device M1 have respective CTAT coefficients which are the same as or very close to each other; that is, their respective CTAT coefficients need not be exactly identical, but can have a slight allowable tolerance in between.

Figure 3:
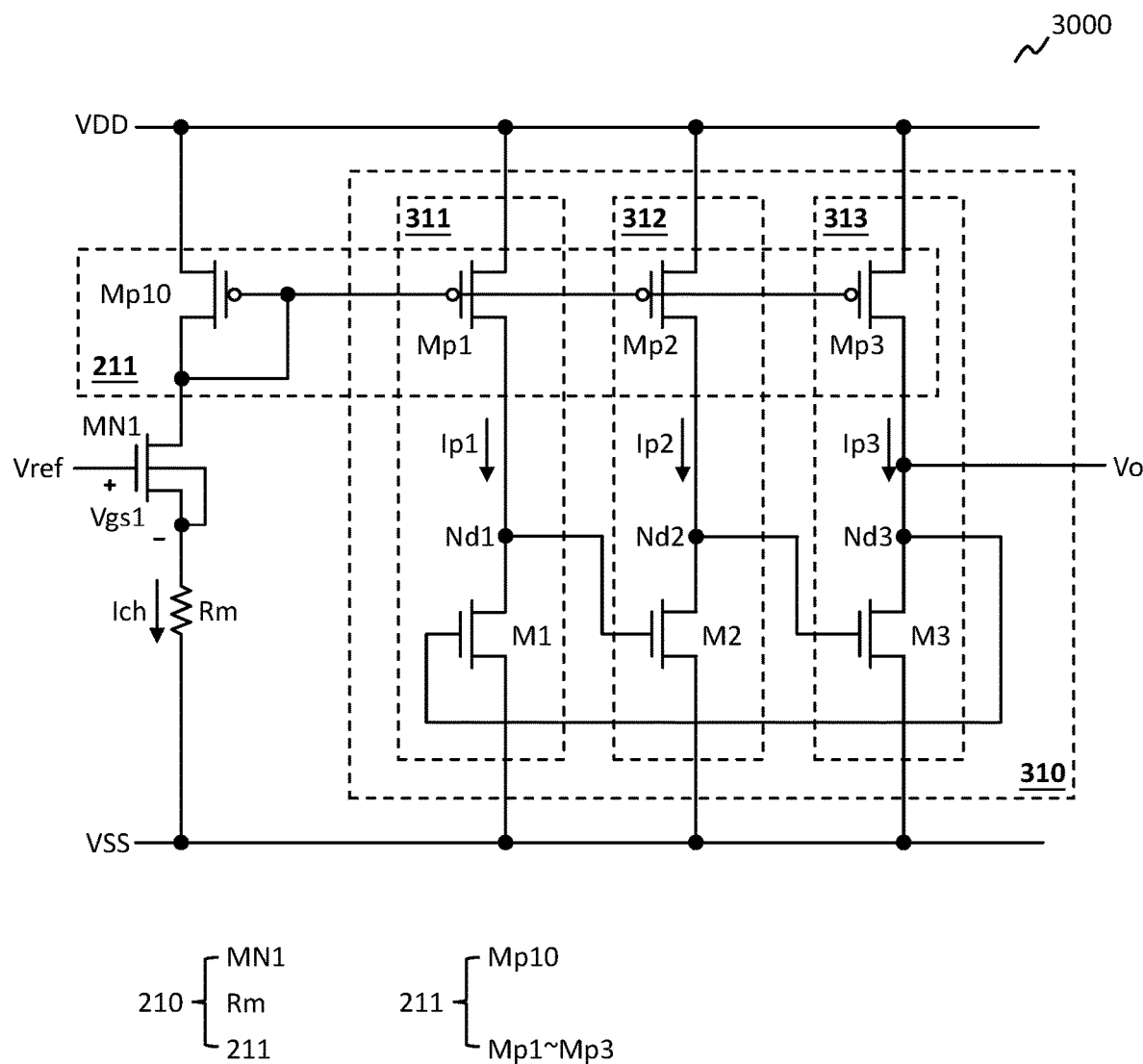
FIG. 3 shows a circuit diagram of a temperature compensated oscillator according to an embodiment of the present invention.

Please refer to FIG. 3, which shows a schematic diagram of a temperature compensated oscillator according to an embodiment of the present invention. The temperature compensated oscillator 3000 of FIG. 3 is a more specific embodiment of the temperature compensated oscillator 2000 of FIG. 2. In one embodiment, the current source 210 in FIG. 3 further includes a current mirror circuit 211, and the current mirror circuit 211 is coupled to the tracking MOS device MN1 to mirror the compensation current Ich into a PTAT current Ip1, a PTAT current Ip2 and a PTAT current Ip3, wherein the PTAT current Ip1, the PTAT current Ip2 and the PTAT current Ip3 respectively flow through the node Nd1 at the drain terminal of the MOS device M1, the node Nd2 at the drain terminal of the MOS device M2 and the node Nd3 at the drain terminal of the MOS device M3. In one embodiment, the current mirror circuit 211 includes an MOS device Mp10, an MOS device Mp1, an MOS device Mp2, and an MOS device Mp3 which have the same conductivity type. In the present embodiment, all the MOS device Mp10 and MOS devices Mp1-Mp3 are P-type metal oxide semiconductor devices (that is, PMOS devices), and the source of the MOS device Mp10 is coupled to the power supply voltage VDD.

In one embodiment, the ring oscillator in the temperature compensated oscillator of the present invention includes at least three odd-numbered coupled inverters. In the present embodiment, the ring oscillator 310 of FIG. 3 includes an inverter 311, an inverter 312 and an inverter 313, wherein the inverter 311 includes a MOS device M1 and a MOS device Mp1 connected in series with each other, the inverter 312 includes a MOS device M2 and a MOS device Mp2 connected in series with each other, and the inverter 313 includes a MOS device M3 and a MOS device Mp3 connected in series with each other. In one embodiment, the conductivity types of the two MOS devices in each inverter are opposite to each other. In the present embodiment, the MOS devices M1-M3 are NMOS devices, whereas, the MOS devices Mp1-Mp3 are PMOS devices; the sources of the MOS devices M1-M3 are coupled to the ground potential VSS, and the sources of the MOS devices Mp1-Mp3 are coupled to the power supply voltage VDD.

Please still refer to FIG. 3. In one embodiment, the gate and the drain of the MOS device Mp10 are coupled to each other, and the gate of the MOS device Mp10 is further coupled to the gates of the MOS devices Mp1-Mp3. In one embodiment, the gate of the MOS device M1 is coupled to the drain of the MOS device M3; the drain of the MOS device M1 is coupled to the gate of the MOS device M2; and the drain of the MOS device M2 is coupled to the gate of the MOS device M3. It should be noted that, in the embodiment of FIG. 3, the current mirror circuit 211 and the ring oscillator 310 share the MOS devices Mp1-Mp3.

In one embodiment, the compensation current Ich is equal to the gate voltage Vref of the tracking MOS device MN1 minus the CTAT gate-source voltage Vgs1 of the tracking MOS device MN1, and divided by the CTAT resistance of the resistor Rm. It should be noted that, in the above embodiment, the temperature coefficient of the gate voltage Vref of the tracking MOS device MN1 is zero. Specifically, the compensation current Ich can be represented by the following formula 2:

$$Ich = (Vref - Vgs1)/Rm \quad \text{(formula 2)}$$

As we see from the above formula 2, since the gate-source voltage Vgs1 of the tracking MOS device MN1 and the resistance of the resistor Rm both have CTAT coefficients, and the temperature coefficient of the gate voltage Vref of the tracking MOS device MN1 is zero, the compensation current Ich has a PTAT coefficient, so that the current Ip1, the current Ip2, and the current Ip3 generated by mirroring the compensation current Ich all have PTAT coefficients, thereby compensating the CTAT coefficient of the ring oscillator 310. It should be noted that the compensation current Ich and the resistor Rm of the present invention have a relationship in the order of first power, so compared with the prior art, the present invention has a better temperature compensation capability.

Figure 4:
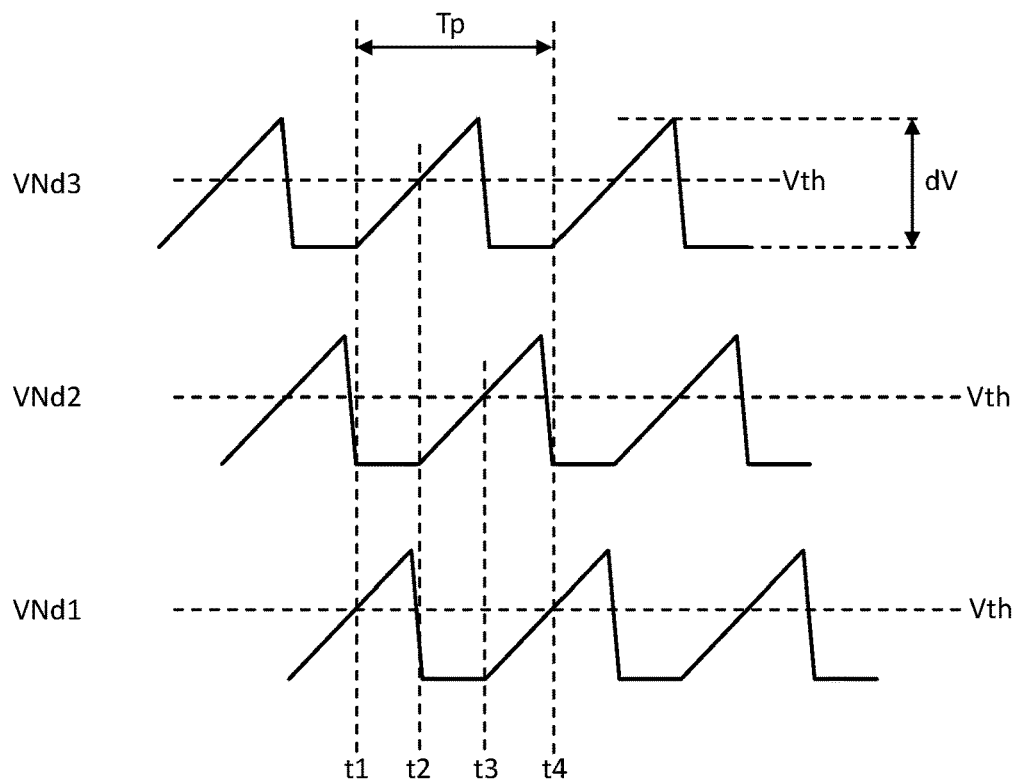
FIG. 4 shows an operation waveform corresponding to the embodiment of FIG. 3.

Please refer to FIG. 4. FIG. 4 shows an operation waveform corresponding to an embodiment of FIG. 3. As shown in FIG. 4, in one embodiment, at the time point t1, the voltage VNd3 at the node Nd3 (that is, the gate voltage of the MOS device M1 or the voltage of the oscillation signal Vo) gradually increases with time. In one embodiment, at the time point t2, the voltage VNd3 rises to exceed the turn-on voltage threshold Vth of the MOS device, whereby the MOS device M1 is turned on, and the voltage VNd1 at the node Nd1 is at a low level, so the MOS device M2 is off, and the voltage VNd2 at the node Nd2 (that is, the gate voltage of the MOS device M3) gradually rises with time. In one embodiment, at the time point t3, the voltage VNd2 rises to exceed the turn-on voltage threshold Vth of the MOS device, whereby the MOS device M3 is turned on, and the voltage VNd3 at the node Nd3 is at a low level, so the MOS device M1 is off, and the voltage VNd1 at the node Nd1 (that is, the gate voltage of the MOS device M2) gradually rises with time. In one embodiment, at the time point t4, the voltage VNd1 rises to exceed the turn-on voltage threshold Vth of the MOS device, whereby the MOS device M2 is turned on, and the voltage VNd2 at the node Nd2 is at a low level, so the MOS device M3 is off, and the voltage VNd3 gradually rises with time.

In one embodiment, the period Tp (that is, the period of the voltage VNd3 or the period of the oscillation signal Vo) in the waveform diagram of FIG. 4 can be represented by the following formula 3:

$$Tp = 3\alpha^*(Ceq^*dV/Imp3 + Ceq^*dV/Im3) \quad \text{(formula 3)}$$

It should be noted that in formula 3, $\alpha$ is a constant; Ceq is the gate equivalent capacitance of the respective MOS device M1, MOS device M2, and MOS device M3; dV is the gate-source voltage of the respective MOS device M1, MOS device M2, and MOS device M3, that is, the difference between the highest level and the lowest level of the voltage VNd3, voltage VNd2, or voltage VNd1 in FIG. 4; Imp3 is the source-drain current flowing through the MOS device Mp3; and Im3 is the gate current flowing through the MOS device M3.

It should also be noted that the above-mentioned gate equivalent capacitance Ceq has a PTAT coefficient, the gate-source voltage dV has a CTAT coefficient, the current Imp3 has a PTAT coefficient, and the current Im3 has a CTAT coefficient. In the present embodiment, the above-mentioned PTAT and CTAT coefficients both come from the NMOS devices in the ring oscillator 310, not from the PMOS devices in the ring oscillator 310. Therefore, the tracking MOS device MN1 has a good tracking effect on the NMOS device in the ring oscillator 310, so that the temperature compensation oscillator 3000 of the present invention has an excellent temperature compensation effect.

Figure 5:
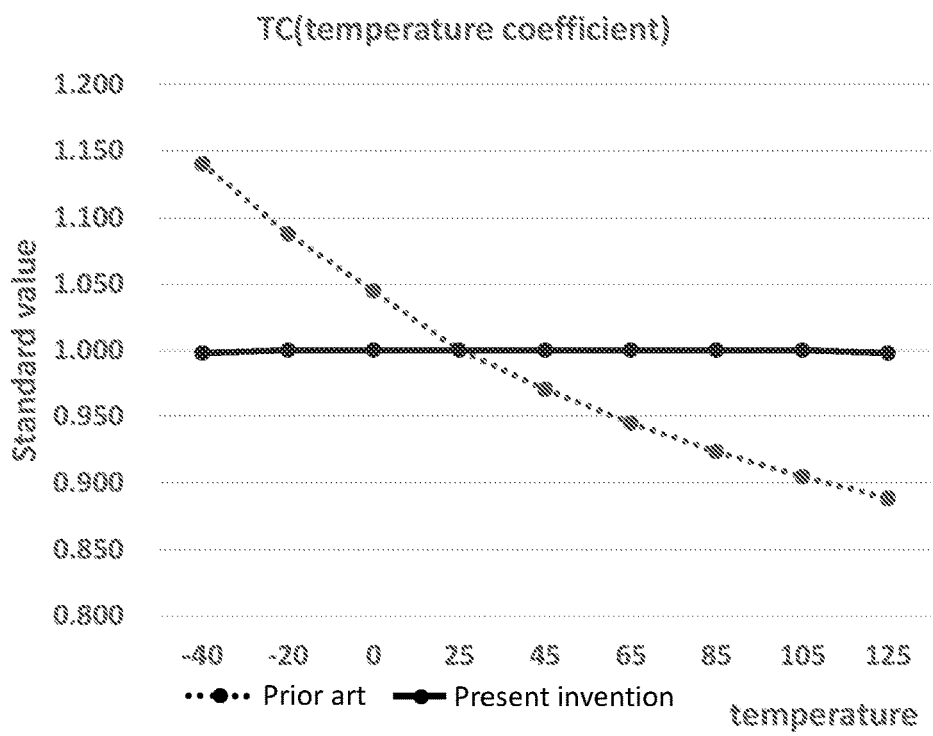
FIG. 5 shows temperature coefficient curves of temperature compensated oscillators of the present invention and prior art.
Figure 6:
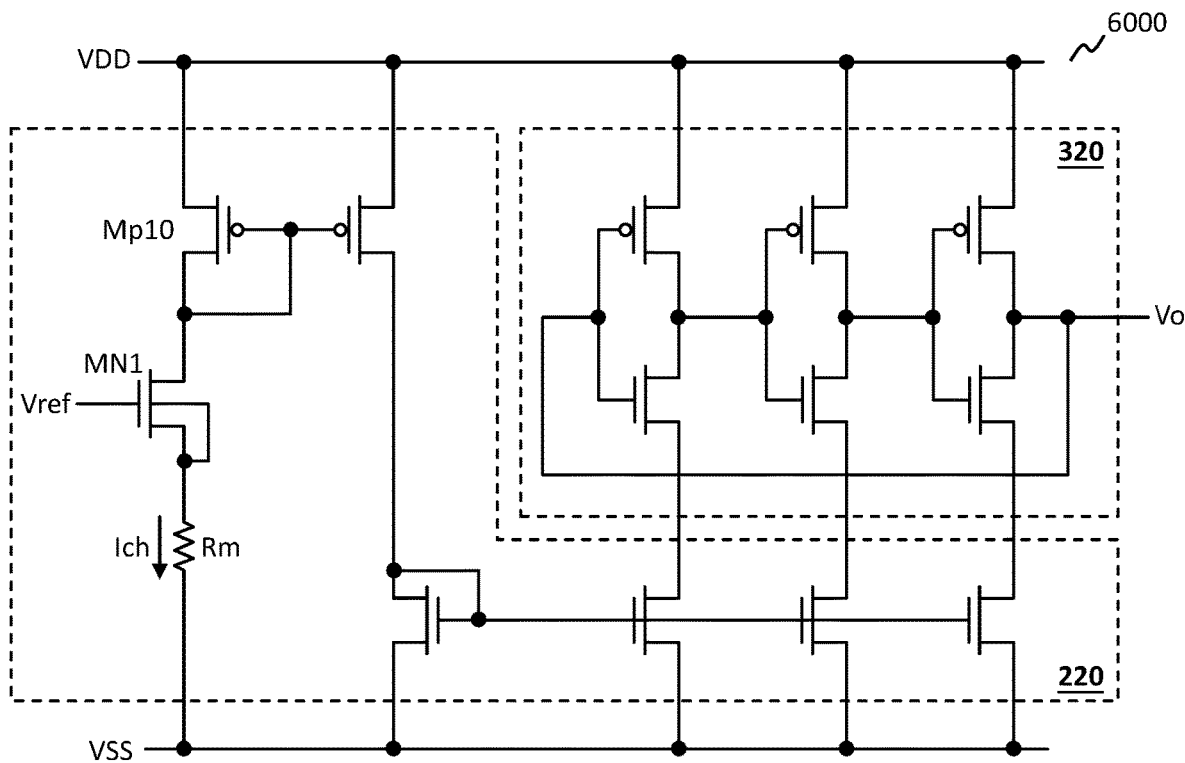
FIG. 6 shows a circuit diagram of a temperature compensated oscillator according to a specific embodiment of the present invention.
Figure 7:
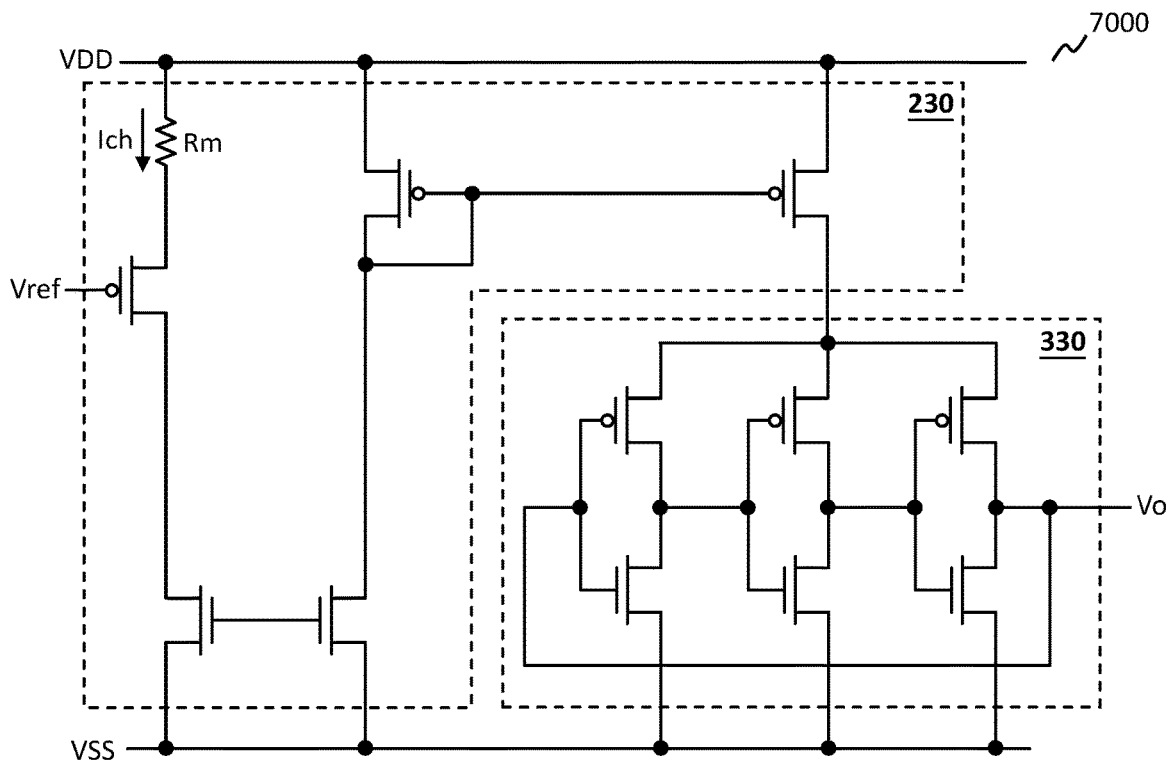
FIG. 7 shows a circuit diagram of a temperature compensated oscillator according to a specific embodiment of the present invention.
Figure 8:
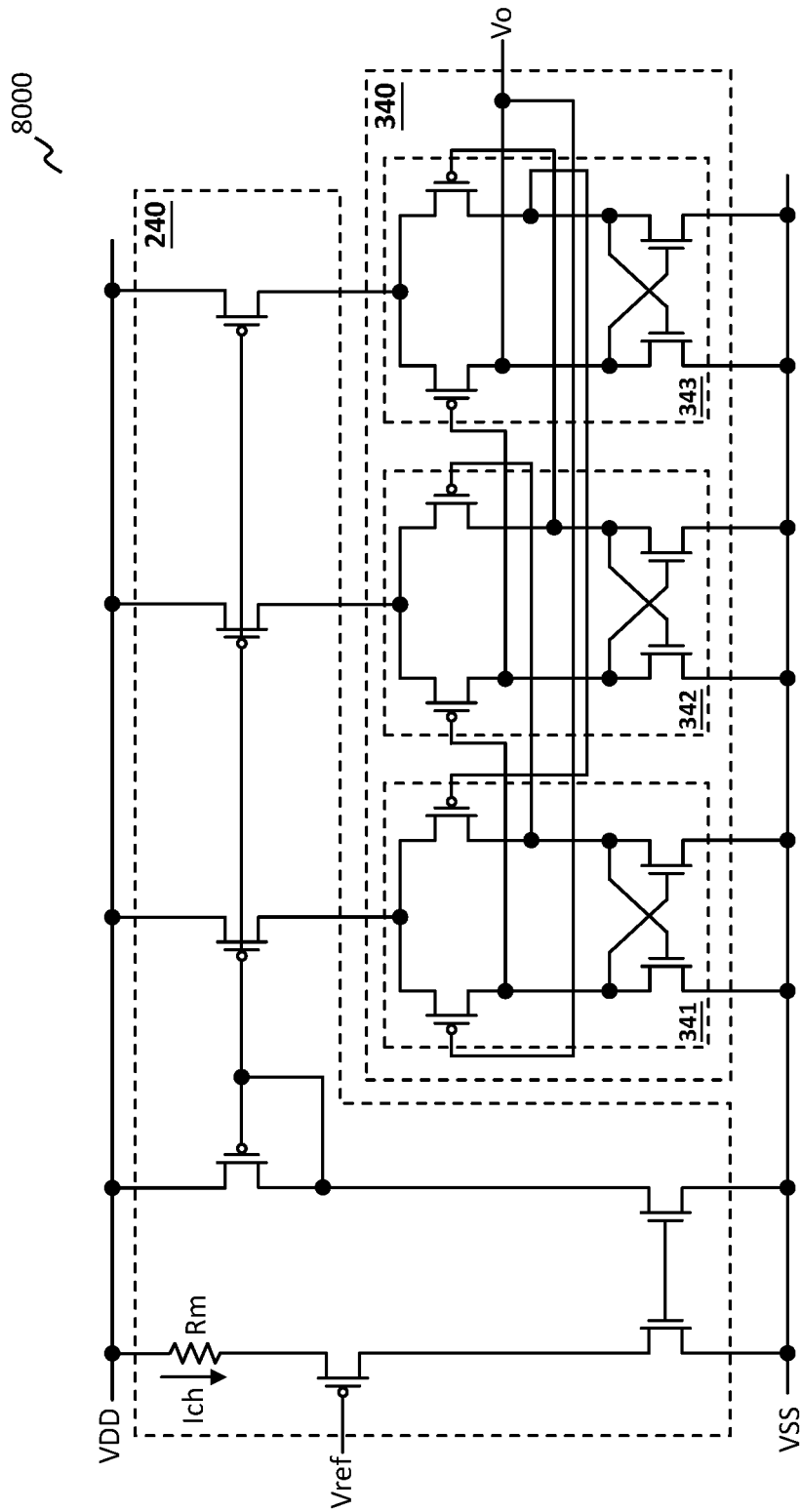
FIG. 8 shows a circuit diagram of a temperature compensated oscillator according to a specific embodiment of the present invention.
Figure 9:
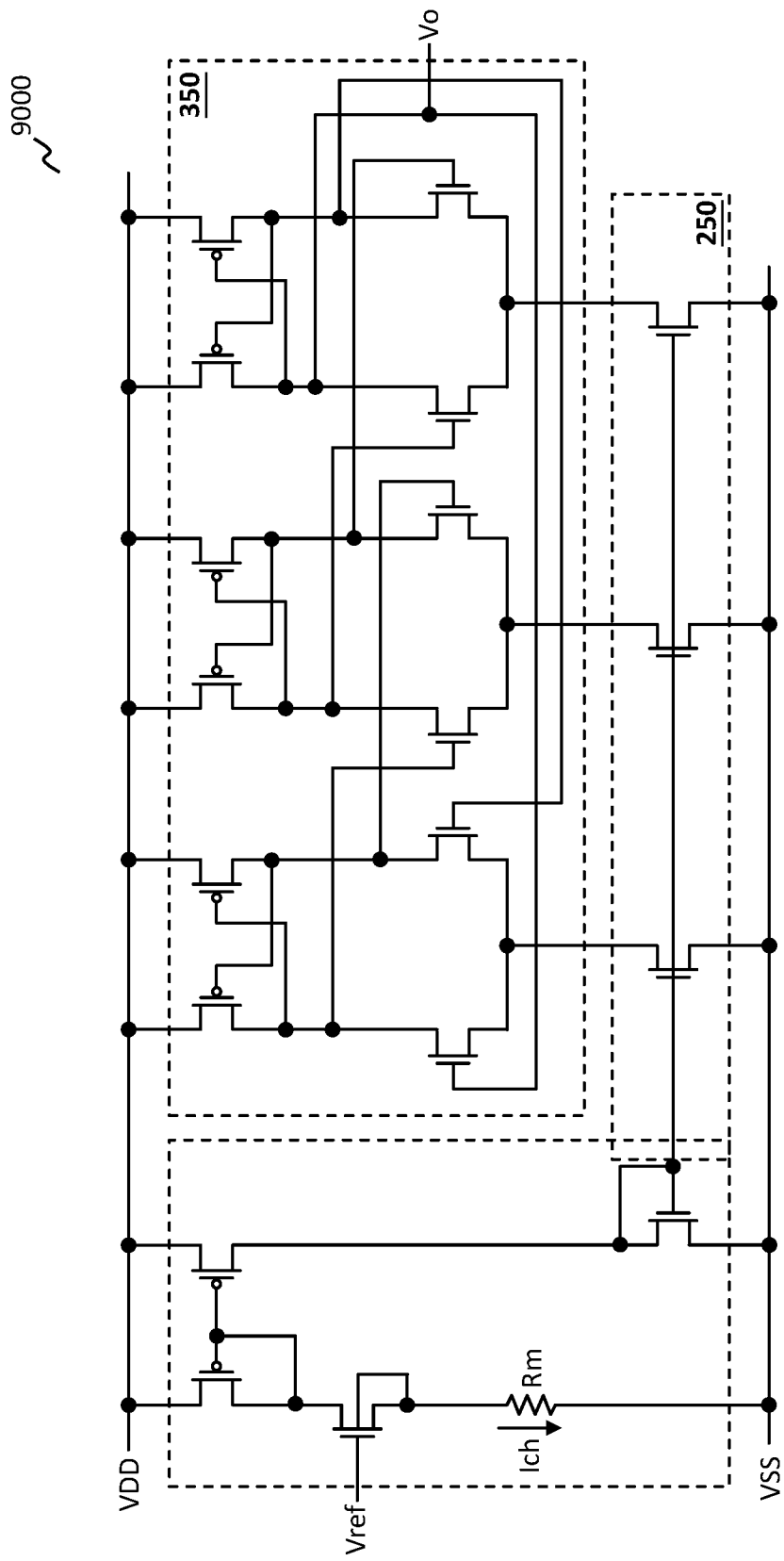
FIG. 9 shows a circuit diagram of a temperature compensated oscillator according to a specific embodiment of the present invention.

Please refer to FIG. 5. FIG. 5 shows temperature coefficient curves of temperature compensated oscillator of the present invention and the prior art. As shown in FIG. 5, after the temperature compensation by the temperature compensated oscillator of the present invention, the temperature coefficient curve is close to a flat line, which shows that the present invention has an excellent temperature compensation effect and is superior to the prior art.

Please refer to FIG. 6 to FIG. 9. FIG. 6 to FIG. 9 show schematic diagrams of the temperature compensated oscillator according to several specific embodiments of the present invention. In one embodiment, the temperature compensated oscillator 6000 of FIG. 6 includes a current source 220 and a ring oscillator 320, and the ring oscillator 320 includes three coupled inverters. In one embodiment, the temperature compensated oscillator 7000 of FIG. 7 includes a current source 230 and a ring oscillator 330, and the ring oscillator 330 includes three coupled inverters. In one embodiment, the temperature compensated oscillator 8000 of FIG. 8 includes a current source 240 and a ring oscillator 340, and the ring oscillator 340 includes at least three odd-numbered coupled delay units. In this embodiment, the at least three odd-numbered coupled delay units include a delay unit 341, a delay unit 342 and a delay unit 343, and the three delay units are coupled in a latch form. In one embodiment, the temperature compensated oscillator 9000 of FIG. 9 includes a current source 250 and a ring oscillator 350. In this embodiment, the ring oscillator 350 includes three delay units coupled in a latch form.

The operational details of the above-mentioned embodiments of FIG. 6 to FIG. 9 can be deduced by those skilled in the art from the embodiment of FIG. 3, so details thereof are not repeated here. It can be known from the embodiments shown in FIGS. 6 to 9 that the temperature compensated oscillator of the present invention can be used to cooperate with various forms of ring oscillators, not limited to the ring oscillators shown in FIGS. 6 to 9. The present invention compensates the CTAT coefficient of the ring oscillator by the PTAT current that has a relationship with the resistor in the order of first power, and by the tracking effect of the tracking MOS device on the MOS device in the ring oscillator, so that the present invention has an excellent temperature compensation effect.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. The various embodiments described above are not limited to being used alone; two embodiments may be used in combination, or a part of one embodiment may be used in another embodiment. For example, other process steps or structures, such as a metal silicide layer, may be added. For another example, the lithography process step is not limited to the mask technology but it can also include electron beam lithography, immersion lithography, etc. Therefore, in the same spirit of the present invention, those skilled in the art can think of various equivalent variations and various combinations, and there are many combinations thereof, and the description will not be repeated here. The scope of the present invention should include what are defined in the claims and the equivalents.

What is claimed is:

1. A temperature compensated oscillator, comprising:
   a current source circuit, configured to generate a bias current, wherein the bias current has a positive temperature coefficient (PTAT); and
   a ring oscillator, wherein an oscillation operation of the ring oscillator is determined by at least three odd-numbered first MOS devices and the bias current, and each of the first MOS devices respectively receives a sub-bias current corresponding to the bias current to form an inverter, and the oscillation operation is formed by cascading and feeding back multiple stages of the inverters, so as to generate an oscillation signal having an oscillation frequency, wherein an operational temperature coefficient of the oscillation frequency is at least related to the positive temperature coefficient of the bias current and a turn-on voltage threshold of one of the first MOS devices;
   wherein the current source circuit includes a tracking MOS device and a resistor connected in series to determine the bias current, and a gate of the tracking MOS device is biased by a predetermined bias voltage, thereby regulating the bias current, and a gate-source voltage of the tracking MOS device has a negative temperature coefficient (CTAT), so that the bias current has a positive temperature coefficient, thereby compensating for the operational temperature coefficient to approximately zero;
   wherein the tracking MOS device and the first MOS devices have the same conductivity type, and the gate-source voltage of the tracking MOS device and a gate-source voltage of the first MOS devices have interdependent temperature coefficient variations, so that under different process corner variations, the operational temperature coefficient remains consistent.

2. The temperature compensated oscillator of claim 1, wherein a resistance of the resistor has a negative temperature coefficient, wherein the bias current is negatively related to the first power of the resistance, thereby the bias current having the positive temperature coefficient, wherein the bias current is proportional to a compensation current flowing through the resistor.

3. The temperature compensated oscillator of claim 2, wherein the compensation current is equal to the predetermined bias voltage minus the gate-source voltage of the tracking MOS device having the negative temperature coefficient and divided by the resistance that has the negative temperature coefficient.

4. The temperature compensated oscillator of claim 3, wherein a temperature coefficient of the predetermined bias voltage is zero.

5. The temperature compensated oscillator of claim 1, wherein the ring oscillator comprises at least three odd-numbered second MOS devices, wherein the first MOS devices and the second MOS devices have opposite conductivity types to form the multiple stages of the inverters;
   wherein the second MOS devices are configured to mirror the compensation current to generate the corresponding sub-bias currents;
   wherein a gate of each of the first MOS devices corresponds to an input terminal of each of the multiple stages of the inverters, and a drain of each of the first MOS devices corresponds to an output terminal of each of the multiple stages of the inverters, and is biased by the corresponding sub-bias current, such that one of the multiple stages of the inverters generates the oscillation signal;
   wherein a switching threshold voltage for a state transition of the multiple stages of the inverters is positively correlated to the turn-on voltage threshold of the first MOS devices.

6. The temperature compensated oscillator of claim 1, wherein the ring oscillator comprises at least three odd-numbered coupled delay units, and wherein the at least three odd-numbered coupled delay units are coupled in a latch form.

7. A temperature compensated oscillator, comprising:
   a current source circuit, configured to generate a bias current, wherein the bias current has a positive temperature coefficient (PTAT); and
   a ring oscillator, wherein an oscillation operation of the ring oscillator is determined by at least three odd-numbered first MOS devices and the bias current, and each of the first MOS devices respectively receives a sub-bias current corresponding to the bias current to form an inverter, and the oscillation operation is formed by cascading and feeding back multiple stages of the inverters, so as to generate an oscillation signal having an oscillation frequency, wherein an operational temperature coefficient of the oscillation frequency is at least related to the positive temperature coefficient of the bias current and a turn-on voltage threshold of one of the first MOS devices;
wherein the current source circuit includes a tracking MOS device and a resistor connected in series to determine the bias current, and a gate of the tracking MOS device is biased by a predetermined bias voltage, thereby regulating the bias current;
wherein a resistance of the resistor has a negative temperature coefficient (CTAT), wherein the bias current is negatively related to the first power of the resistance, thereby the bias current having the positive temperature coefficient, so as to compensate for the operational temperature coefficient to approximately zero, wherein the bias current is proportional to a compensation current flowing through the resistor.

8. The temperature compensated oscillator of claim 7, wherein the compensation current is equal to the predetermined bias voltage minus the gate-source voltage of the tracking MOS device having the negative temperature coefficient and divided by the resistance that has the negative temperature coefficient.

9. The temperature compensated oscillator of claim 8, wherein a temperature coefficient of the predetermined bias voltage is zero.

10. The temperature compensated oscillator of claim 7, wherein the ring oscillator comprises at least three odd-numbered second MOS devices, wherein the first MOS devices and the second MOS devices have opposite conductivity types to form the multiple stages of the inverters;
wherein a gate and a drain of each of the first MOS devices respectively corresponds to an input terminal and an output terminal of corresponding one of the inverters, and the drain is biased by a bias current associated with the PTAT current, such that one of the inverters generates the oscillation signal;
wherein a switching threshold voltage for switching a state of each of the inverters is positively related to the turn-on voltage threshold of the first MOS device.

11. The temperature compensated oscillator of claim 7, wherein the ring oscillator comprises at least three odd-numbered coupled delay units, and wherein the at least three odd-numbered coupled delay units are coupled in a latch form.

12. A ring oscillator temperature compensation method, comprising:
biasing a tracking MOS device and a resistor connected in series with a predetermined bias voltage to generate a bias current, wherein the bias current has a positive temperature coefficient (PTAT); and
generating an oscillation signal having an oscillation frequency in a ring-feedback manner based on the bias current, wherein an operational temperature coefficient of the oscillation frequency is related to the positive temperature coefficient of the bias current and a turn-on voltage threshold of a first MOS device configured to generate the oscillation signal;
wherein a gate-source voltage of the tracking MOS device has a negative temperature coefficient (CTAT), so that the bias current has a positive temperature coefficient, thereby compensating for the operational temperature coefficient to approximately zero;
wherein the tracking MOS device and the first MOS device have the same conductivity type, and the gate-source voltage of the tracking MOS device and a gate-source voltage of the first MOS devices have interdependent temperature coefficient variations, so that under different process corner variations, the operational temperature coefficient remains consistent.

13. The ring oscillator temperature compensation method of claim 12, wherein a resistance of the resistor has a negative temperature coefficient (CTAT), wherein the bias current is negatively related to the first power of the resistance, thereby the bias current having the positive temperature coefficient, wherein the bias current is proportional to a compensation current flowing through the resistor.

14. The ring oscillator temperature compensation method of claim 13, wherein the compensation current is equal to the predetermined bias voltage minus the gate-source voltage of the tracking MOS device having the negative temperature coefficient and divided by the resistance that has the negative temperature coefficient.

15. The ring oscillator temperature compensation method of claim 14, wherein a temperature coefficient of the predetermined bias voltage is zero.

16. The ring oscillator temperature compensation method of claim 12,
wherein the step of generating the bias current further comprises: mirroring the compensation current as the bias current by a second MOS device, wherein the first MOS device and the second MOS device have opposite conductivity types;
wherein a switching threshold voltage for a state transition of the oscillation signal is positively correlated to the turn-on voltage threshold of the first MOS device.

17. The temperature compensated oscillator of claim 1, wherein the oscillation frequency has an intrinsic temperature coefficient, which has a negative temperature coefficient, wherein the intrinsic temperature coefficient of the oscillation frequency refers to a temperature-dependent variation tendency of the oscillation frequency caused by electrical characteristics of the first MOS devices, excluding the influence of the positive temperature coefficient of the bias current;
wherein the positive temperature coefficient of the bias current compensates for an intrinsic temperature coefficient of the ring oscillator, so that the operational temperature coefficient of the oscillation frequency is approximately zero.

18. The temperature compensated oscillator of claim 5, wherein the oscillation frequency is substantially independent of electrical characteristics of the second MOS devices.

19. The ring oscillator temperature compensation method of claim 12, wherein the oscillation frequency has an intrinsic temperature coefficient, which has a negative temperature coefficient, wherein the intrinsic temperature coefficient of the oscillation frequency refers to a temperature-dependent variation tendency of the oscillation frequency caused by electrical characteristics of the first MOS devices, excluding the influence of the positive temperature coefficient of the bias current;
wherein the positive temperature coefficient of the bias current compensates for an intrinsic temperature coefficient of the ring oscillator, so that the operational temperature coefficient of the oscillation frequency is approximately zero.

20. The ring oscillator temperature compensation method of claim 16, wherein the oscillation frequency is substantially independent of electrical characteristics of the second MOS devices.

* * * * *